United States Patent
Krishnan et al.

(10) Patent No.: US 7,498,879 B2
(45) Date of Patent: Mar. 3, 2009

(54) SUMMING COMPARATOR FOR HIGHER ORDER CLASS D AMPLIFIERS

(75) Inventors: Jagadeesh Krishnan, Dallas, TX (US); Srinath M. Ramaswamy, Dallas, TX (US); Gangadhar Burra, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 27 days.

(21) Appl. No.: 11/389,709

(22) Filed: Mar. 27, 2006

(65) Prior Publication Data

US 2007/0024366 A1    Feb. 1, 2007

(51) Int. Cl.
*H03F 3/217* (2006.01)

(52) U.S. Cl. .................. 330/251; 330/310; 330/69; 330/302

(58) Field of Classification Search ............. 330/207 A, 330/251, 310, 69, 302; 327/339; 340/870.21; 341/166
See application file for complete search history.

(56) References Cited

U.S. PATENT DOCUMENTS

| | | | |
|---|---|---|---|
| 4,647,905 A * | 3/1987 | Hantke et al. | 341/166 |
| 5,160,896 A * | 11/1992 | McCorkle | 330/251 |
| 6,300,825 B1 * | 10/2001 | Dijkmans et al. | 330/10 |
| 6,518,837 B2 * | 2/2003 | Berkhout | 330/10 |
| 6,614,297 B2 * | 9/2003 | Score et al. | 330/10 |
| 6,924,700 B2 * | 8/2005 | Taura et al. | 330/251 |
| 7,038,535 B2 * | 5/2006 | Lee | 330/10 |

\* cited by examiner

*Primary Examiner*—Patricia Nguyen
(74) *Attorney, Agent, or Firm*—Alan K. Stewart; W. James Brady; Frederick J. Telecky, Jr.

(57) ABSTRACT

The summing comparator includes: a first integrator; a second integrator for receiving an output of the first integrator; and a comparator for switching when the output of the first integrator is greater than the output of the second integrator. The outputs of the first and second integrators are directly compared by the comparator without the necessity of a summing amplifier.

6 Claims, 1 Drawing Sheet

SUMMING COMPARATOR FOR HIGHER ORDER CLASS D AMPLIFIERS

CROSS REFERENCE TO RELATED APPLICATIONS

Ser. No. 11/193,867 filed Jul. 29, 2005, entitled "Class-D Amplifier System".

FIELD OF THE INVENTION

The present invention relates to electronic circuits, and more specifically, to a summing comparator for higher order class D amplifiers.

BACKGROUND OF THE INVENTION

FIG. 1 shows a standard prior art implementation of a summing comparator. The device of FIG. 1 includes integrators 20 and 22; summing amplifier 24; comparator 26; resistors RI, RF, RZ; capacitors CI and CZ; DC reference voltage 28; common mode voltages VCM1 and VCM2; integrator 20 output Vp; integrator 22 output Vm; and source voltage nodes VDDA and GND. The outputs of integrators 20 and 22 are summed using a buffer or some kind of an instrumentation amplifier (summing amplifier 24) and then the sum is compared to a DC reference voltage 28 or ground GND by comparator 26. As long as this output is greater than the DC reference voltage, the comparator 26 switches. The disadvantage with this method is that it needs summing amplifier 24. Such an implementation is area expensive and consumes more power. In the implementation shown in FIG. 8, the comparator switches when $$V_p > V_m \Rightarrow \left(\frac{-K}{s} - \frac{K^2}{s^2}\right) > 0 \Rightarrow \frac{-K}{s} > \frac{K^2}{s^2}$$

Where $$\frac{-K}{s}$$

represents the output of integrator 20 at node Vp, $$\frac{K^2}{s^2}$$

represents the output of integrator 22 at node Vm, $$\frac{-K}{s} - \frac{K^2}{s^2}$$

represents the output of summing amplifier 24, and the DC reference voltage is ground.

SUMMARY OF THE INVENTION

A summing comparator includes: a first integrator; a second integrator for receiving an output of the first integrator; and a comparator for switching when the output of the first integrator is greater than the output of the second integrator. The outputs of the first and second integrators are directly compared by the comparator without the necessity of a summing amplifier.

DETAILED DESCRIPTION OF PREFERRED EMBODIMENTS

Figure 1:
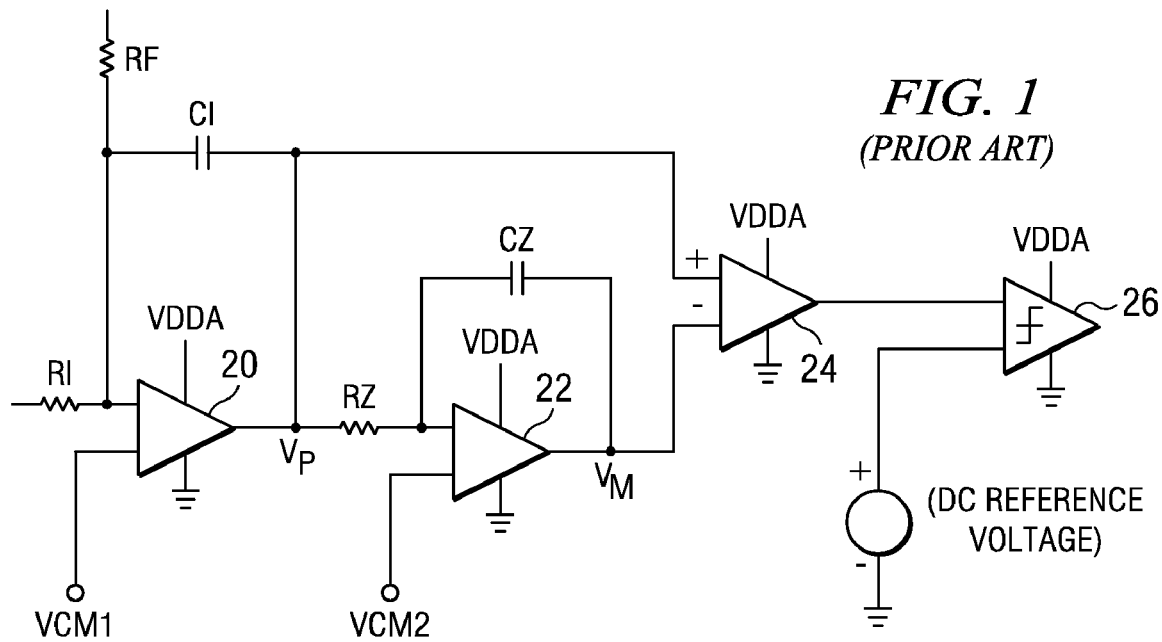
FIG. 1 is a circuit diagram of a standard prior art implementation of a summing comparator.
Figure 2:
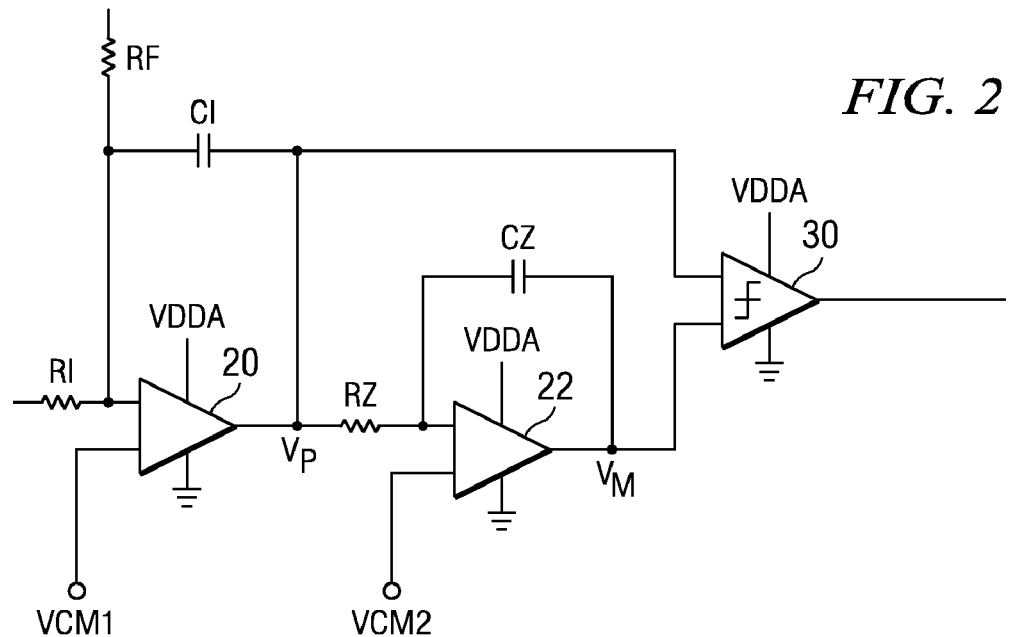
FIG. 2 is a circuit diagram of a preferred embodiment summing comparator, according to the present invention.

In the preferred embodiment summing comparator, shown in FIG. 2, the summing amplifier 24 and comparator 26 of the prior art device, shown in FIG. 1, are replaced by comparator 30. The output of integrator 20 and the output of integrator 22 are directly compared by comparator 30 without the necessity of a summing amplifier. The equation below shows that the preferred embodiment implementation shown in FIG. 2 is mathematically and electrically similar to the prior art invention of FIG. 1, with the additional advantage of being a low-area and low power solution.

$$V_p > V_m \Rightarrow \frac{-K}{s} > \frac{K^2}{s^2} \Rightarrow \left(\frac{-K}{s} - \frac{K^2}{s^2}\right) > 0$$

Where $$\frac{-K}{s}$$

represents the output of integrator 20 at node Vp, $$\frac{K^2}{s^2}$$

represents the output of integrator 22 at node Vm.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A circuit comprising:
   a first integrator;
   a second integrator coupled to an output of the first integrator for integrating an output signal of the first integrator; and
   a comparator having a first input coupled to the output of the first integrator and a second input directly connected to an output of the second integrator.

2. The circuit of claim 1 wherein the comparator switches when the output of the first integrator is greater than the output of the second integrator.

3. A circuit comprising:
   a first integrator;
   a second integrator for integrating an output of the first integrator; and
   a switching device for switching when the output of the first integrator is greater than an output of the second integrator.

4. The circuit of claim 3 wherein the switching device is a comparator.

5. A method for performing a summing comparator function comprising:
   integrating an input signal and providing a first integrated output signal;
   integrating the first integrated output signal and providing a second integrated output signal; and
   comparing the first integrated output signal with the second integrated output signal.

6. The method of claim 5 wherein the step of comparing determines if the first integrated output signal is greater than the second integrated output signal.

* * * * *